(12) United States Patent
Kono et al.

(10) Patent No.: US 8,354,715 B2
(45) Date of Patent: Jan. 15, 2013

(54) SEMICONDUCTOR DEVICE AND METHOD OF FABRICATING THE SAME

(75) Inventors: Hiroshi Kono, Kanagawa (JP); Takashi Shinohe, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 112 days.

(21) Appl. No.: 12/873,749

(22) Filed: Sep. 1, 2010

(65) Prior Publication Data

US 2011/0057202 A1    Mar. 10, 2011

(30) Foreign Application Priority Data

Sep. 9, 2009    (JP) .................................. 2009-207740

(51) Int. Cl.
*H01L 29/76* (2006.01)
*H01L 29/94* (2006.01)

(52) U.S. Cl. ........ 257/341; 257/342; 257/343; 257/327; 438/270

(58) Field of Classification Search .......... 257/341–343, 257/327, 77, E21.383, E29.198; 438/270
See application file for complete search history.

(56) References Cited

U.S. PATENT DOCUMENTS

| | | | | |
|---|---|---|---|---|
| 5,814,859 A | * | 9/1998 | Ghezzo et al. | 257/335 |
| 6,054,352 A | * | 4/2000 | Ueno | 438/268 |
| 2003/0235942 A1 | * | 12/2003 | Nakamura et al. | 438/138 |

* cited by examiner

*Primary Examiner* — Theresa T Doan

(74) *Attorney, Agent, or Firm* — Oblon, Spivak, McClelland, Maier & Neustadt, L.L.P.

(57) ABSTRACT

According to the embodiments, a semiconductor device using SiC and having a high breakdown voltage, a low on-resistance, and excellent reliability is provided. The semiconductor device includes a silicon carbide substrate having first and second main surfaces; a first silicon carbide layer of a first conductive type provided on the first main surface of the silicon carbide substrate; first silicon carbide regions of a second conductive type formed on a surface of the first silicon carbide layer; second silicon carbide regions of the first conductive type formed on respective surfaces of the first silicon carbide regions; third silicon carbide regions of the second conductive type formed on the respective surfaces of the first silicon carbide regions; a fourth silicon carbide region of the second conductive type formed between the facing first silicon carbide regions with the first silicon carbide layer therebetween; a gate insulating film formed continuously on surfaces of the first silicon carbide regions, the first silicon carbide layer, and the fourth silicon carbide region; a gate electrode formed on the gate insulating film; an interlayer insulating film which covers the gate electrode; a first electrode which is electrically connected to the second silicon carbide regions and the third silicon carbide regions; and a second electrode formed on the second main surface of the silicon carbide substrate.

5 Claims, 7 Drawing Sheets

SEMICONDUCTOR DEVICE AND METHOD OF FABRICATING THE SAME

CROSS-REFERENCE TO RELATED APPLICATION

This application is based upon and claims the benefit of priority from Japanese Patent Application No. 2009-207740, filed on Sep. 9, 2009, the entire contents of which are incorporated herein by reference.

FIELD

Embodiments described herein relate generally to a high breakdown voltage semiconductor device using silicon carbide (SiC).

BACKGROUND

As next-generation materials for power semiconductor devices, silicon carbide (hereinafter, also referred to as SiC) is expected. SiC has superior physical properties to Si; specifically, the band gap is three times higher, the breakdown field strength is about ten times higher, and the thermal conductivity is about three times higher. By utilizing such properties, an ultra-low-power-loss and high-temperature operable power semiconductor device can be implemented.

There are a variety of high breakdown voltage semiconductor devices using such SiC properties. As one of such devices, a Double Implantation MOSFET (hereinafter, referred to as DIMOSFET) is known in which p-wells and source regions are formed by ion implantation.

A DIMOSFET uses a planar process in which channels can be formed with higher accuracy by an ion implantation process, and thus fabrication thereof is easy. In addition, since gate drive is controlled by voltage, the power of a drive circuit can be reduced and thus a DIMOSFET is an excellent device suitable also for parallel operation.

However, in a SiC DIMOSFET, the electric field applied to an upper portion of a portion sandwiched between facing p-wells (hereinafter, referred to as JFET region) is high because of its structure. Hence, there is a problem that device breakdown occurs in a gate insulating film formed on a surface of a JFET portion.

DETAILED DESCRIPTION

Embodiments will be described below with reference to the drawings.

(First Embodiment)

A semiconductor device according to the present embodiment includes a silicon carbide substrate having first and second main surfaces; a first silicon carbide layer of a first conductive type provided on the first main surface of the silicon carbide substrate; first silicon carbide regions of a second conductive type formed at or on a surface of the first silicon carbide layer; second silicon carbide regions of the first conductive type formed at or on respective surfaces of the first silicon carbide regions; third silicon carbide regions of the second conductive type formed at or on the respective surfaces of the first silicon carbide regions; a fourth silicon carbide region of the second conductive type formed between the facing first silicon carbide regions with the first silicon carbide layer therebetween; a gate insulating film formed continuously on surfaces of the first silicon carbide regions, the first silicon carbide layer, and the fourth silicon carbide region; a gate electrode formed on the gate insulating film; an interlayer insulating film which covers the gate electrode; a first electrode which is electrically connected to the second silicon carbide regions and the third silicon carbide regions; and a second electrode formed on the second main surface of the silicon carbide substrate.

Figure 1:
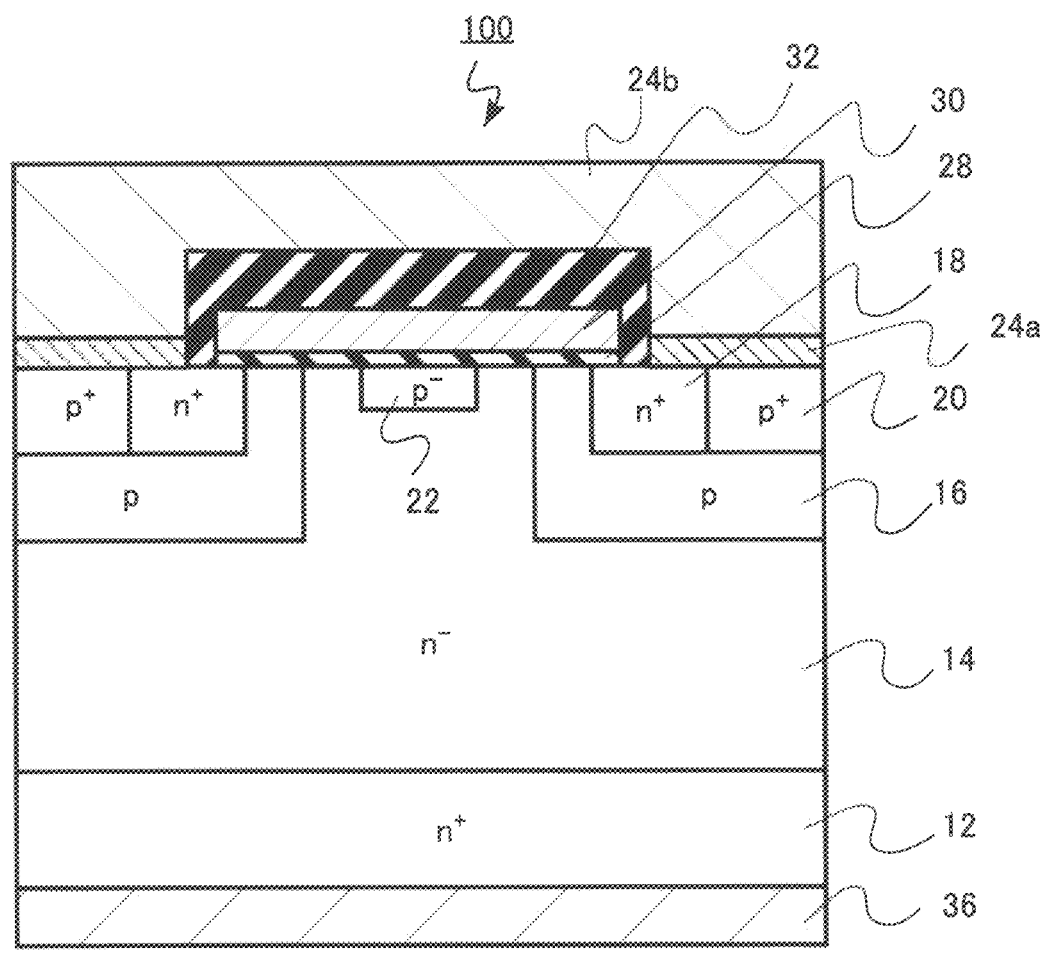
FIG. 1 is a cross-sectional view showing a configuration of a MOSFET which is a semiconductor device according to a first embodiment.

FIG. 1 is a cross-sectional view showing a configuration of a MOSFET which is a semiconductor device according to the present embodiment. This MOSFET 100 includes a SiC substrate (silicon carbide substrate) 12 having first and second main surfaces. In FIG. 1, the first main surface is a surface on the upper side in the drawing and the second main surface is a surface on the lower side in the drawing. The SiC substrate 12 is a hexagonal SiC substrate (n$^+$ substrate) containing, for example, N (nitrogen) as an n-type impurity at an impurity concentration on the order of $5 \times 10^{18}$ to $1 \times 10^{19}$ cm$^{-3}$.

A first n-type SiC layer (n$^-$ layer) 14 with an n-type impurity concentration on the order of $5 \times 10^{15}$ to $2 \times 10^{16}$ cm$^{-3}$ is formed on the first main surface of the SiC substrate 12. The film thickness of the n$^-$ layer 14 is on the order of, for example, 5 to 10 µm.

First p-type SiC regions (p-well regions) 16 with a p-type impurity concentration on the order of $1 \times 10^{17}$ to $5 \times 10^{17}$ cm$^{-3}$ are formed on a part of a surface of the n$^-$ layer 14. The depth of the p-well regions 16 is on the order of, for example, 0.6 µm.

A second n-type SiC region (source region) 18 with an n-type impurity concentration on the order of $1 \times 10^{20}$ is formed at a part of a surface of each first SiC region (p-well region) 16. The depth of the source regions 18 is shallower than the depth of the first SiC regions (p-well regions) 16 and is on the order of, for example, 0.3 µm.

In addition, a third p-type SiC region (p-well contact region) 20 with a p-type impurity concentration on the order of $1 \times 10^{19}$ to $1 \times 10^{20}$ cm$^{-3}$ is formed at a part of the surface of each first SiC region (p-well region) 16 and at the side of a second n-type SiC region (source region) 18. The depth of the p-well contact regions 20 is shallower than the depth of the first SiC regions (p-well regions) 16 and is on the order of, for example, 0.3 μm.

Furthermore, a fourth p-type SiC region (p⁻ region) 22 is formed between the facing first SiC regions (p-well regions) 16 with the first SiC layer (n⁻ layer) 14 therebetween. The p-type impurity concentration of the fourth SiC region (p⁻ region) 22 is on the order of $1\times10^{17}$ to $5\times10^{18}$ cm$^{-3}$.

It is desirable that the depth of the fourth p-type SiC region (p⁻ region) 22 be shallower than the depth of the first SiC regions (p-well regions) 16 in terms of further suppression of an increase in on-resistance. The depth of the fourth p-type SiC region (p⁻ region) 22 is on the order of, for example, 0.1 μm.

Note that it is desirable that the impurity in the fourth SiC region (p⁻ region) 22 be aluminum having a low diffusion speed for the following reason. If the diffusion speed of the impurity is high, the profile of the fourth SiC region (p⁻ region) 22 is not stabilized, resulting in the characteristics of the MOSFET becoming unstable.

Furthermore, the MOSFET 100 includes a gate insulating film 28 which is formed continuously on the surfaces of the first SiC regions (p-well regions) 16, the first SiC layer (n⁻ layer) 14, and the fourth SiC region (p⁻ region) 22 so as to extend over these regions and layer. For the gate insulating film 28, for example, a Si oxide film or a high-k insulating film can be used.

A gate electrode 30 is formed on the gate insulating film 28. For the gate electrode 30, for example, polysilicon can be used. An interlayer insulating film 32 formed of, for example, a silicon oxide film, is formed on the gate electrode 30.

Then, the MOSFET 100 includes a first electrode (common electrode for a source and p-wells) 24 which is electrically connected to the second SiC regions (source regions) 18 and the third SiC regions (p-well contact regions) 20. The first electrode (common electrode for the source and the p-wells) 24 includes, for example, Ni barrier metal layers 24a and an Al metal layer 24b formed on the barrier metal layers 24a. The Ni barrier metal layers 24a and the Al metal layer 24b may form an alloy by reaction. In addition, a second electrode (drain electrode) 36 is formed on the second main surface of the SiC substrate 12.

Note that, in the present embodiment, an n-type impurity is preferably P (phosphorus), for example, but N (nitrogen), As (arsenic) or the like, can also be used. Note also that a p-type impurity is preferably Al (aluminum), for example, but B (boron) or the like , can also be used.

In the MOSFET 100 according to the present embodiment, the fourth p-type SiC region (p⁻ region) 22 is formed underneath the gate insulating film 28 in a JFET region. Hence, when the MOSFET 100 is in an off state, depletion is promoted in an upper portion of the JFET region. Therefore, the field intensity applied to the gate insulating film 28 in the upper portion of the JFET region can be suppressed to a low level over the case in which such a region is not provided. Accordingly, breakdown of the gate insulating film occurring when a high voltage is applied to the device is suppressed and the reliability of the gate insulating film improves.

The JFET width, i.e., the distance between the facing first SiC regions (p-well regions) 16, can be maintained large. Thus, a low on-resistance can be achieved. Accordingly, a MOSFET with a high breakdown voltage, a low on-resistance, and excellent reliability can be implemented.

Figure 2:
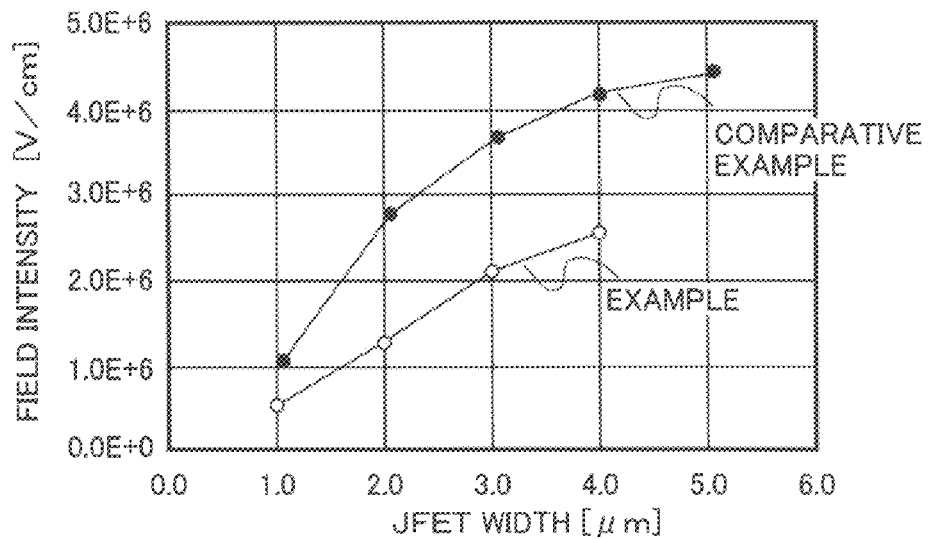
FIG. 2 is a diagram showing simulation results for a field intensity applied to a gate insulating film.

FIG. 2 shows simulation results for a electrical field intensity applied to a gate insulating film. Results of simulations performed based on the structure according to the present embodiment shown in FIG. 1 are shown as an example.

Results obtained with a conventional structure with no fourth p-type SiC region (p⁻ region) are shown as a comparative example. Here, the parameters used in the simulations are as follows:

Thickness of the gate insulating film=50 nm;
Concentration of the n⁻ layer=$1\times10^{16}$ atoms/cm³;
Thickness of the n⁻ layer=10 μm;
Depth of the p-wells=0.6 μm;
Concentration of the p⁻ region=$1\times10^{18}$ atoms/cm$^{-3}$;
Depth of the p⁻ region=0.1 μm;
JFET width=1.0 to 5.0 μm;
Source voltage=0 V;
Drain voltage=1200 V; and
Gate voltage=0 V.

As shown in FIG. 2, it can be seen that the field intensity applied to the gate insulating film is lowered to on the order of one half in the example over the comparative example.

In addition, simulation results for on-current for the example and the comparative example reveal that a reduction in on-current in the example is kept below a 10% reduction which is exhibited in the comparative example, in the JFET width range.

As such, an effect provided by the present embodiment is confirmed by the simulations.

Next, a method of fabricating a semiconductor device according to the present embodiment will be described. FIGS. 3 to 8 are process cross-sectional views showing a method of fabricating a semiconductor device according to the present embodiment.

Figure 3:
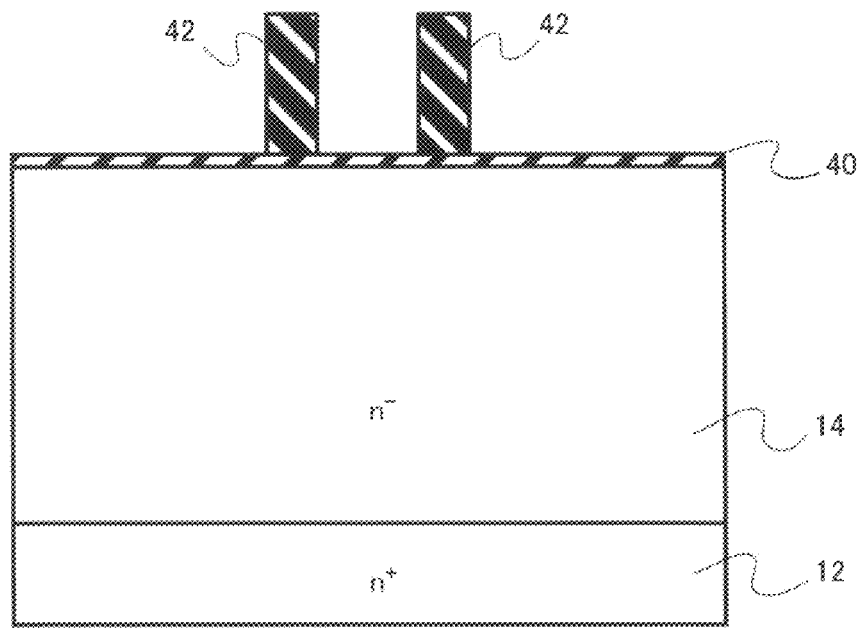
FIG. 3 is a process cross-sectional view showing a method of fabricating a semiconductor device according to the first embodiment.

As shown in FIG. 3, a low-resistance SiC substrate 12 is prepared which contains P (phosphorus) or N (nitrogen) as an n-type impurity at an impurity concentration on the order of $1\times10^{19}$ cm$^{-3}$ and which has, for example, a thickness of 300 μm and a hexagonal system crystal lattice. Then, a high-resistance SiC layer 14 which contains, for example, N as an n-type impurity at an impurity concentration on the order of $5\times10^{15}$ cm$^{-3}$ and which has a thickness on the order of 10 μm is grown on one main surface of the SiC substrate 12 by an epitaxial growth process.

Thereafter, SiO₂ 42 including two regions which are substantially perpendicular to the one main surface of the SiC substrate 12 is patterned on a SiO₂ film 40 on a top surface of the SiC layer 14, which serves as first mask materials. The SiO₂ 42 later serves as a second ion implantation mask.

Figure 4:
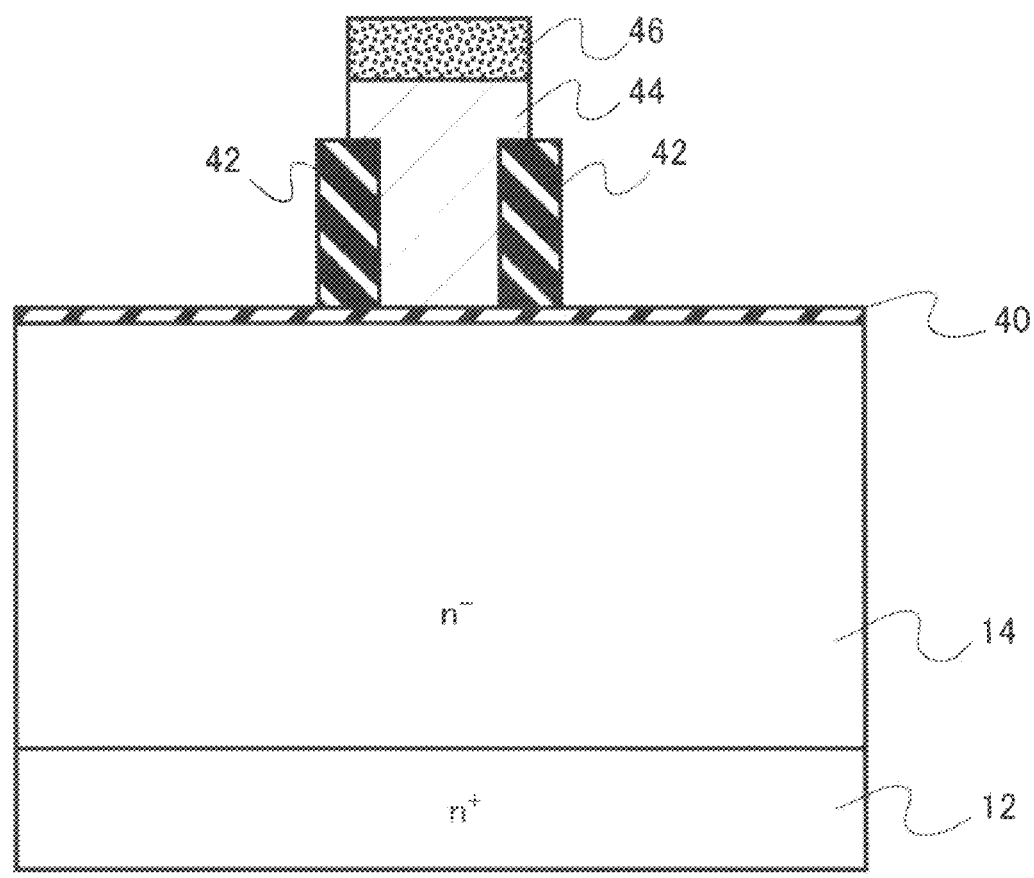
FIG. 4 is a process cross-sectional view showing the method of fabricating a semiconductor device according to the first embodiment.

Thereafter, as shown in FIG. 4, polysilicon 44 is deposited on the SiO₂ 42, whereby the polysilicon 44 which is a second mask material is filled between the SiO₂ 42 which is the first mask materials. Then, the polysilicon 44 is patterned using a resist 46 as a mask, by lithography and an RIE process.

Figure 5:
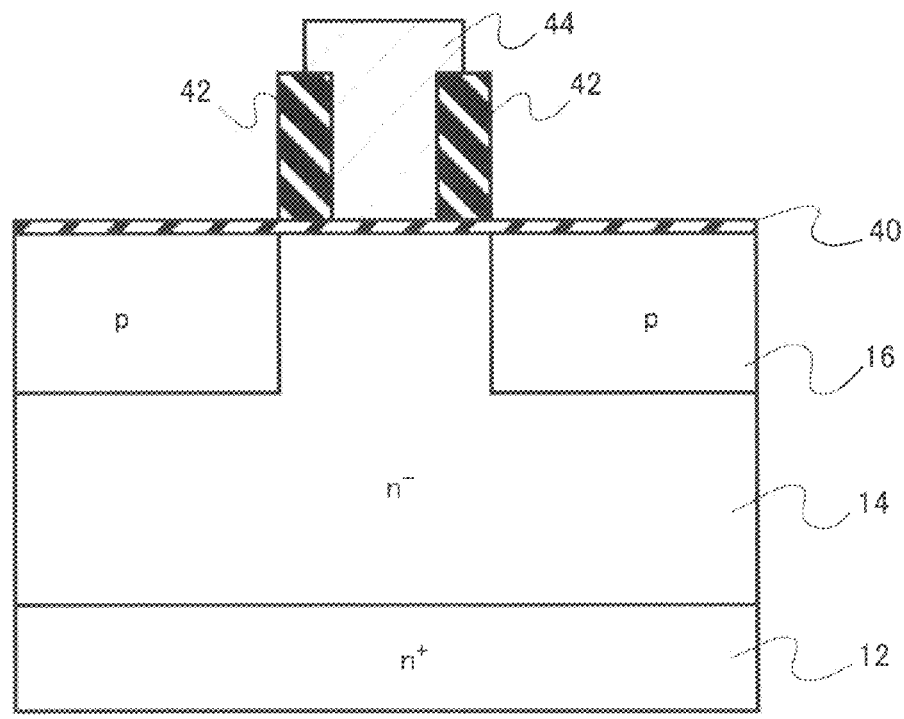
FIG. 5 is a process cross-sectional view showing the method of fabricating a semiconductor device according to the first embodiment.

As shown in FIG. 5, using, as a first ion implantation mask, the SiO₂ 42 which is the first mask materials and the polysilicon 44 which is the second mask material, Al which is a p-type impurity is ion-implanted into the SiC layer 14, forming p-well regions 16. Here, to adjust the final concentration of the p-well regions 16, N which is an n-type impurity may be added and ion implantation may be performed.

Figure 6:
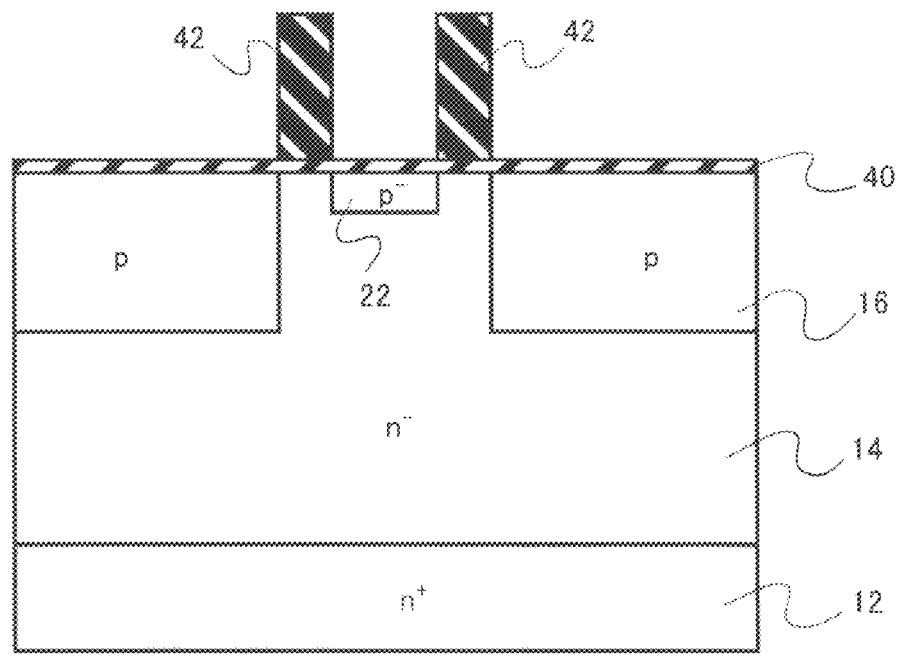
FIG. 6 is a process cross-sectional view showing the method of fabricating a semiconductor device according to the first embodiment.

Next, as shown in FIG. 6, the polysilicon 44 which is the second mask material is removed by, for example, dry etching. Then, using, as the second ion implantation mask, the SiO₂ 42 which is the first mask materials, Al which is a p-type impurity is ion-implanted into the SiC layer 14, forming a p⁻ region 22.

As such, by using the SiO₂ 42 which is the first mask materials in a shared manner as the first ion implantation mask for forming the p-well regions 16 and the second ion implantation mask for forming the p⁻ region 22, the two different regions can be formed by self-alignment.

Figure 7:
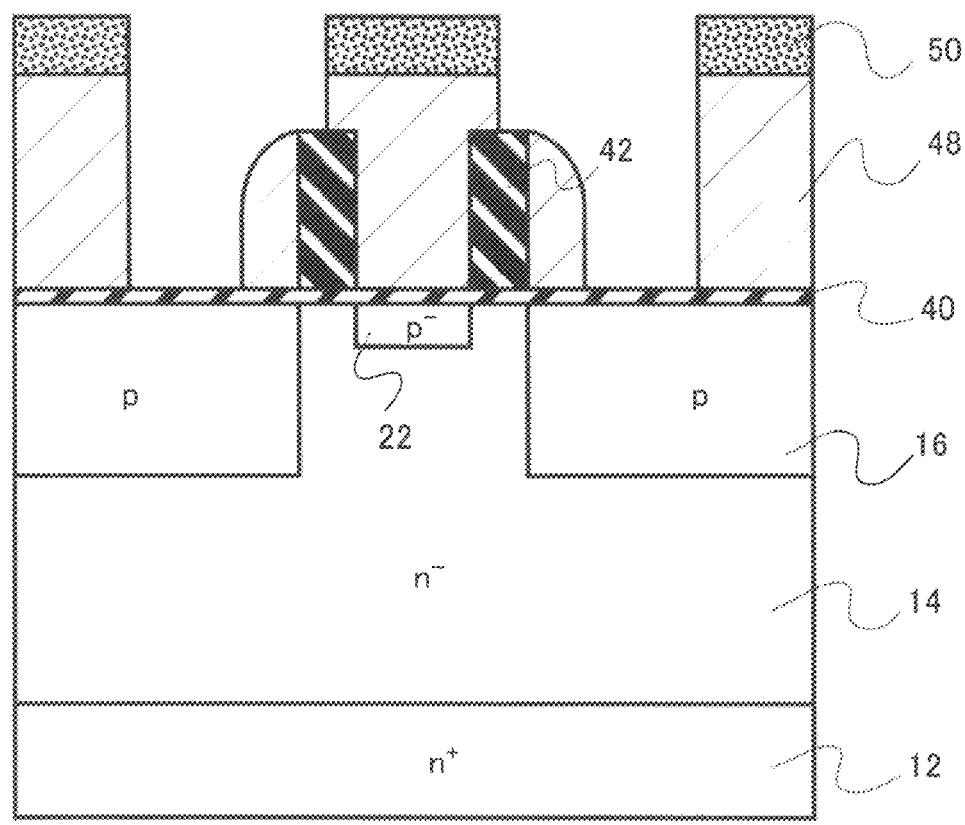
FIG. 7 is a process cross-sectional view showing the method of fabricating a semiconductor device according to the first embodiment.

Then, as shown in FIG. 7, polysilicon 48 is deposited on the SiO$_2$ 42 and patterned using a resist 50 as a mask, by lithography and an RIE process. At this time, a part of the polysilicon 48 is left as sidewalls of the SiO$_2$ 42 which is the first mask materials.

Figure 8:
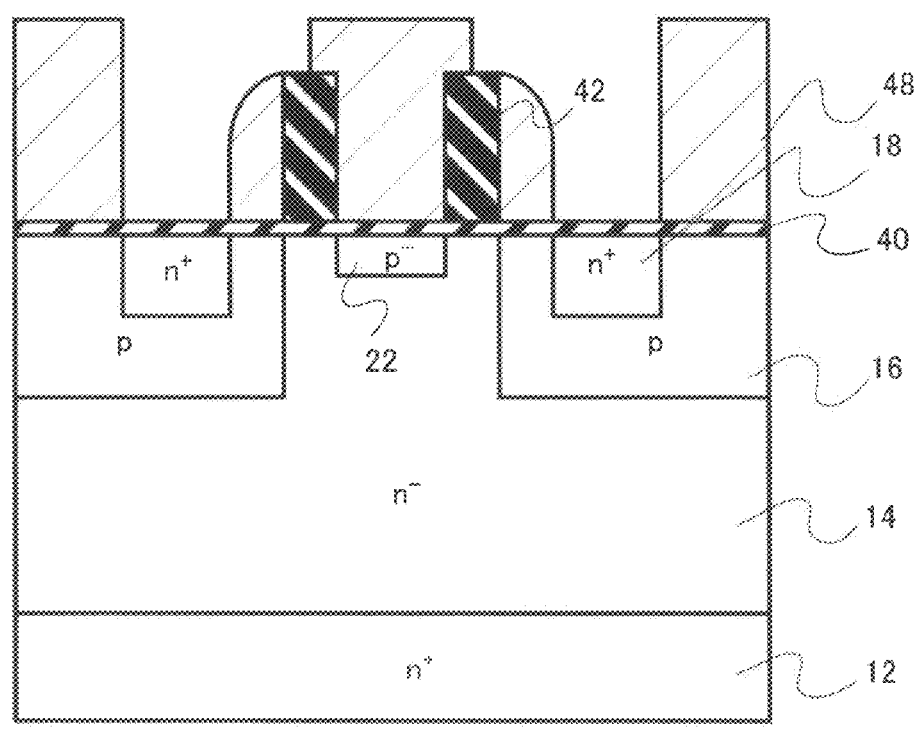
FIG. 8 is a process cross-sectional view showing the method of fabricating a semiconductor device according to the first embodiment.

Then, as shown in FIG. 8, using the polysilicon 48 and the SiO$_2$ 42 as a third ion implantation mask, P which is an n-type impurity is ion-implanted into the SiC layer 14, forming source regions 18. At this time, the source regions 18 are self-aligned with respect to the p-well regions 16 and the p$^-$ region 22.

Thereafter, Al which is a p-type impurity is ion-implanted into the SiC layer 14 using a fourth ion implantation mask (not shown), forming p-well contact regions 20. After this, the ion-implanted impurities are activated by heat treatment at about 1600° C., for example.

Thereafter, a gate insulating film 28, a gate electrode 30, an interlayer insulating film 32, a first electrode (common electrode for a source and p-wells) 24, and a second electrode (drain electrode) 36 are formed by a known semiconductor process, whereby a MOSFET shown in FIG. 1 is fabricated.

According to the fabrication method of the present embodiment, p-well regions 16, a p$^-$ region 22, and source regions 18 whose mutual positional relationship greatly affects the characteristics of a MOSFET can be formed by self-alignment. Therefore, a high-performance MOSFET can be formed stably.

(Second Embodiment)

While a SiC substrate in the first embodiment is of an n-type, a semiconductor device according to the present embodiment is of a p-type and configures an IGBT (Insulated Gate Bipolar Transistor). The semiconductor device according to the present embodiment is the same as that according to the first embodiment except that the type of impurity in a SiC substrate is different, and thus, overlapping description is omitted.

Figure 9:
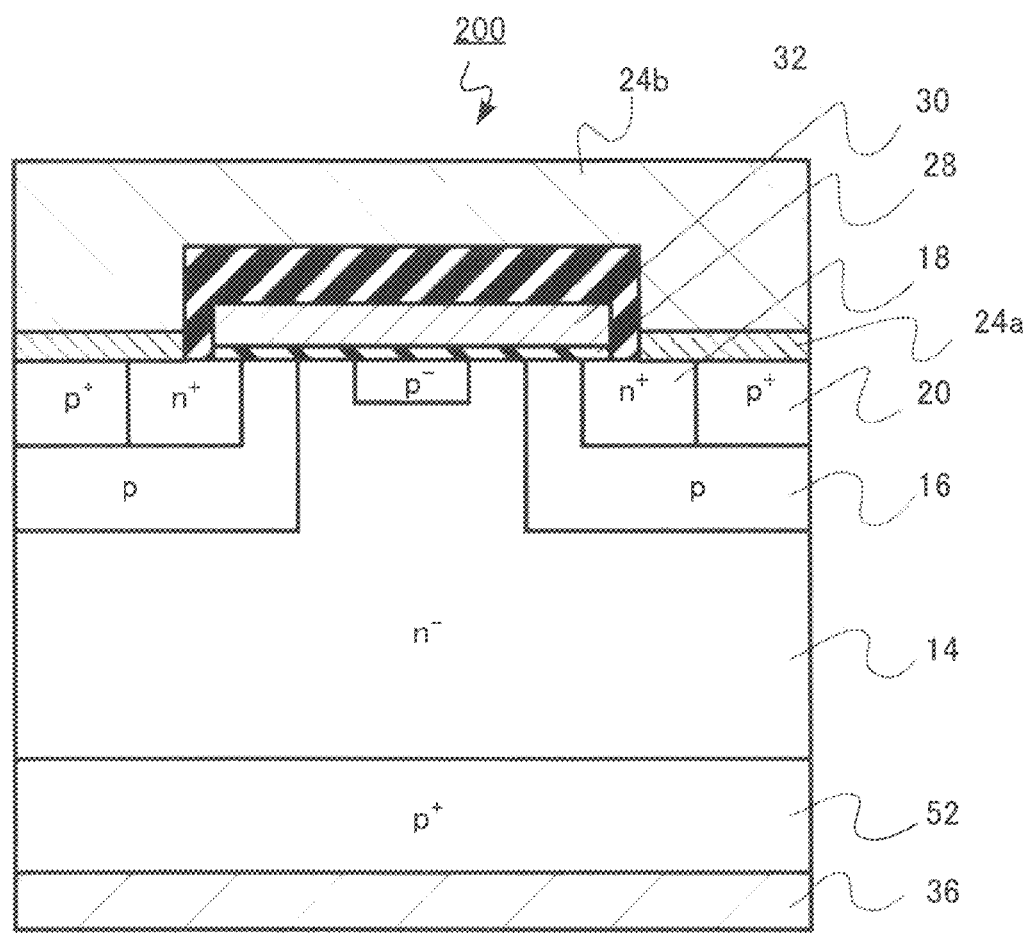
FIG. 9 is a cross-sectional view showing a configuration of an IGBT which is a semiconductor device according to a second embodiment.

FIG. 9 is a cross-sectional view showing a configuration of an IGBT which is a semiconductor device according to the present embodiment. This IGBT 200 includes a SiC substrate (silicon carbide substrate) 52 having first and second main surfaces. In FIG. 9, the first main surface is a surface on the upper side in the drawing and the second main surface is a surface on the lower side in the drawing. The SiC substrate 52 is a hexagonal SiC substrate (p$^+$ substrate) containing, for example, Al as a p-type impurity at an impurity concentration on the order of $5\times10^{18}$ to $1\times10^{19}$ cm$^{-3}$.

In the IGBT 200 of the present embodiment, a fourth p-type SiC region (p$^-$ region) 22 is formed underneath a gate insulating film 28 in a JFET region. Therefore, the electric field applied to the gate insulating film 28 in an upper portion of the JFET region can be suppressed to a low level over the case in which such a region is not provided. In addition, the JFET width, i.e., the distance between facing first SiC regions (p-well regions) 16, can be maintained large. Thus, a low on-resistance can be achieved. Accordingly, an IGBT with a high breakdown voltage, a low on-resistance, and excellent reliability can be implemented.

A method of fabricating a semiconductor device according to the present embodiment is the same as that according to the first embodiment except that a SiC substrate to be prepared is a hexagonal SiC substrate (p$^+$ substrate) containing, for example, Al as a p-type impurity. Therefore, according to the method of fabricating a semiconductor device of the present embodiment, an IGBT with a high breakdown voltage, a low on-resistance, and excellent reliability can be fabricated.

While certain embodiments have been described, these embodiments have been presented by way of example only, and are not intended to limit the scope of the inventions. Indeed, the devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

Although, in the embodiments, for example, an n-type MOSFET and an n-type IGBT which use electrons as carriers are described, the present invention can also be applied to a p-type MOSFET and a p-type IGBT which use holes as carriers.

What is claimed is:

1. A semiconductor device comprising:
   a silicon carbide substrate having first and second main surfaces;
   a first silicon carbide layer of a first conductive type provided on the first main surface of the silicon carbide substrate, the first silicon carbide layer having impurity concentration of $5\times10^{15}$ to $2\times10^{16}$ cm$^{-3}$;
   first silicon carbide regions of a second conductive type formed at a surface of the first silicon carbide layer, the first silicon carbide regions having impurity concentration of $1\times10^{17}$ to $5\times10^{17}$ cm$^{-3}$;
   second silicon carbide regions of the first conductive type formed at respective surfaces of the first silicon carbide regions;
   third silicon carbide regions of the second conductive type formed at the respective surfaces of the first silicon carbide regions;
   a fourth silicon carbide region of the second conductive type formed between the facing first silicon carbide regions with the first silicon carbide layer therebetween, the fourth silicon carbide region having impurity concentration of $1\times10^{17}$ to $5\times10^{18}$ cm$^{-3}$;
   a gate insulating film formed continuously on surfaces of the first silicon carbide regions, the first silicon carbide layer, and the fourth silicon carbide region;
   a gate electrode formed on the gate insulating film;
   an interlayer insulating film configured to cover the gate electrode;
   a first electrode being configured to electrically connect to the second silicon carbide regions and the third silicon carbide regions; and
   a second electrode formed on the second main surface of the silicon carbide substrate,
   wherein a distance between the facing first silicon carbide regions is 1.0 μm to 4.0 μm.

2. The device according to claim 1, wherein a depth of the fourth silicon carbide region is shallower than a depth of the first silicon carbide regions.

3. The device according to claim 1, wherein an impurity of the second conductive type contained in the fourth silicon carbide region is aluminum.

4. The device according to claim 1, wherein the silicon carbide substrate is of the first conductive type and configures a MOSFET.

5. The device according to claim 1, wherein the silicon carbide substrate is of the second conductive type and configures an IGBT.

* * * * *